US009508736B2

(12) United States Patent
Chen et al.

(10) Patent No.: US 9,508,736 B2
(45) Date of Patent: Nov. 29, 2016

(54) THREE-DIMENSIONAL CHARGE TRAPPING NAND CELL WITH DISCRETE CHARGE TRAPPING FILM

(71) Applicant: Cypress Semiconductor Corporation, San Jose, CA (US)

(72) Inventors: Chun Chen, San Jose, CA (US); Kuo-Tung Chang, Saratoga, CA (US); Shenqing Fang, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/056,577

(22) Filed: Oct. 17, 2013

(65) Prior Publication Data

US 2015/0108562 A1    Apr. 23, 2015

(51) Int. Cl.
*H01L 29/792* (2006.01)
*H01L 27/115* (2006.01)
*H01L 29/66* (2006.01)

(52) U.S. Cl.
CPC ..... *H01L 27/11582* (2013.01); *H01L 27/1157* (2013.01); *H01L 29/66833* (2013.01); *H01L 29/7926* (2013.01); *H01L 27/11556* (2013.01)

(58) Field of Classification Search
CPC ............... H01L 27/11556; H01L 27/11582
USPC .......... 257/202, 314, 324, E29.309, E21.21, 257/E21.423, E21.679
See application file for complete search history.

(56) References Cited

U.S. PATENT DOCUMENTS

| 2010/0120214 A1* | 5/2010 | Park et al. ............... 438/287 |
| 2010/0276743 A1* | 11/2010 | Kuniya et al. ............ 257/315 |
| 2011/0147823 A1* | 6/2011 | Kuk ............... H01L 27/11551 257/324 |
| 2011/0198687 A1* | 8/2011 | Lee ......................... 257/326 |
| 2011/0266606 A1 | 11/2011 | Park et al. |
| 2012/0007167 A1 | 1/2012 | Hung et al. |
| 2013/0161724 A1 | 6/2013 | Lee |

OTHER PUBLICATIONS

International Search Report for International Application No. PCT/US2014/060714 dated Jan. 15, 2015; 3 pages.
Written Opinion of the International Searching Authority for International Application No. PCT/US2014/060714 mailed Jan. 15, 2015; 10 pages.

* cited by examiner

*Primary Examiner* — Kimberly Rizkallah
*Assistant Examiner* — Maria Ligai

(57) ABSTRACT

A three-dimensional charge trap semiconductor device is constructed with alternating insulating and gate layers stacked over a substrate. During the manufacturing process, a channel hole is formed in the stack and the gate layers are recessed from the channel hole. Using the recessed topography of the gate layers, a charge trap layer can be deposited on the sidewalls of the channel hole and etched, leaving individual discrete charge trap layer sections in each recess. Filling the channel hole with channel material effectively provides a three-dimensional semiconductor device having individual charge trap layer sections for each memory cell.

9 Claims, 18 Drawing Sheets

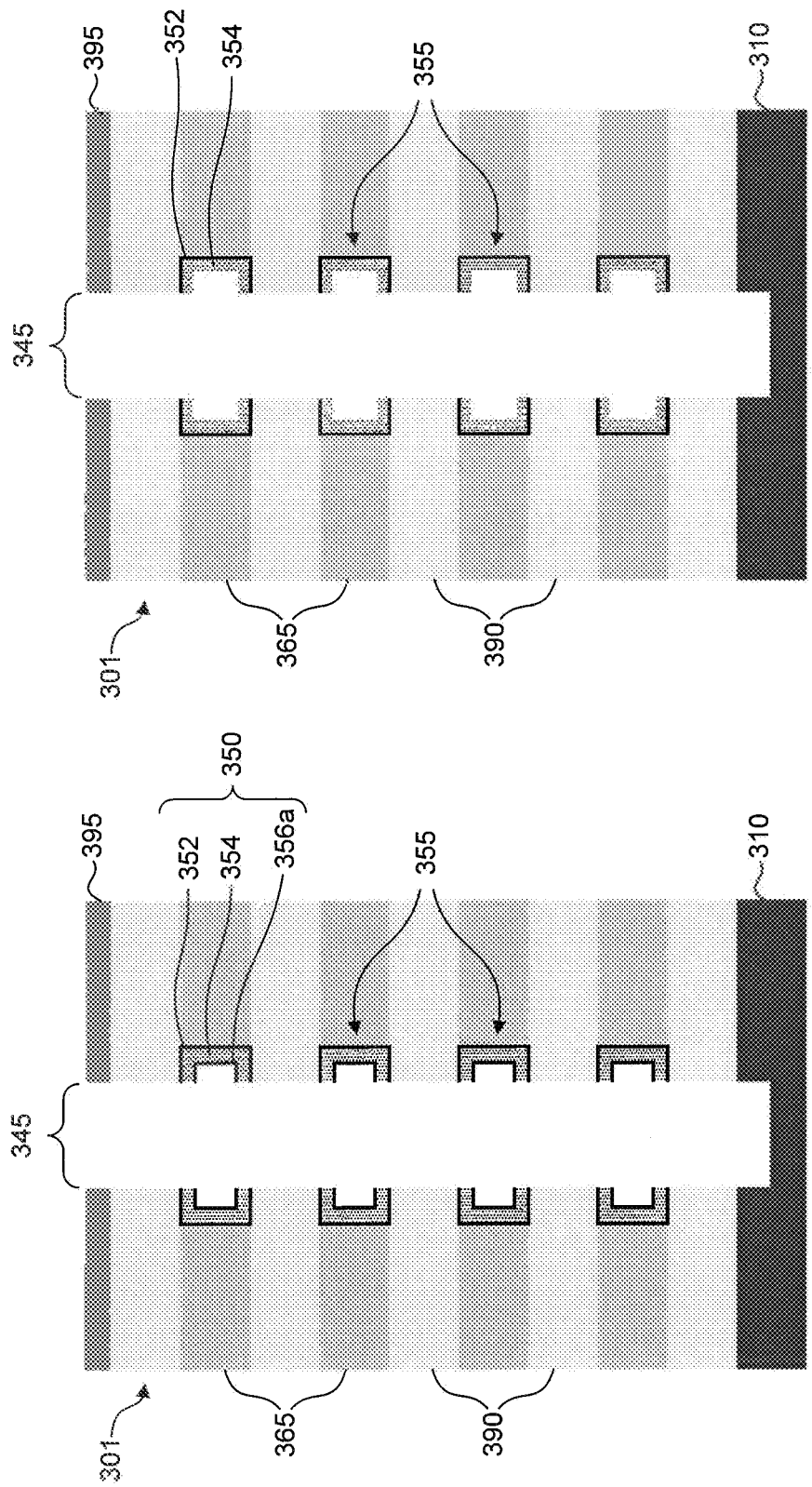

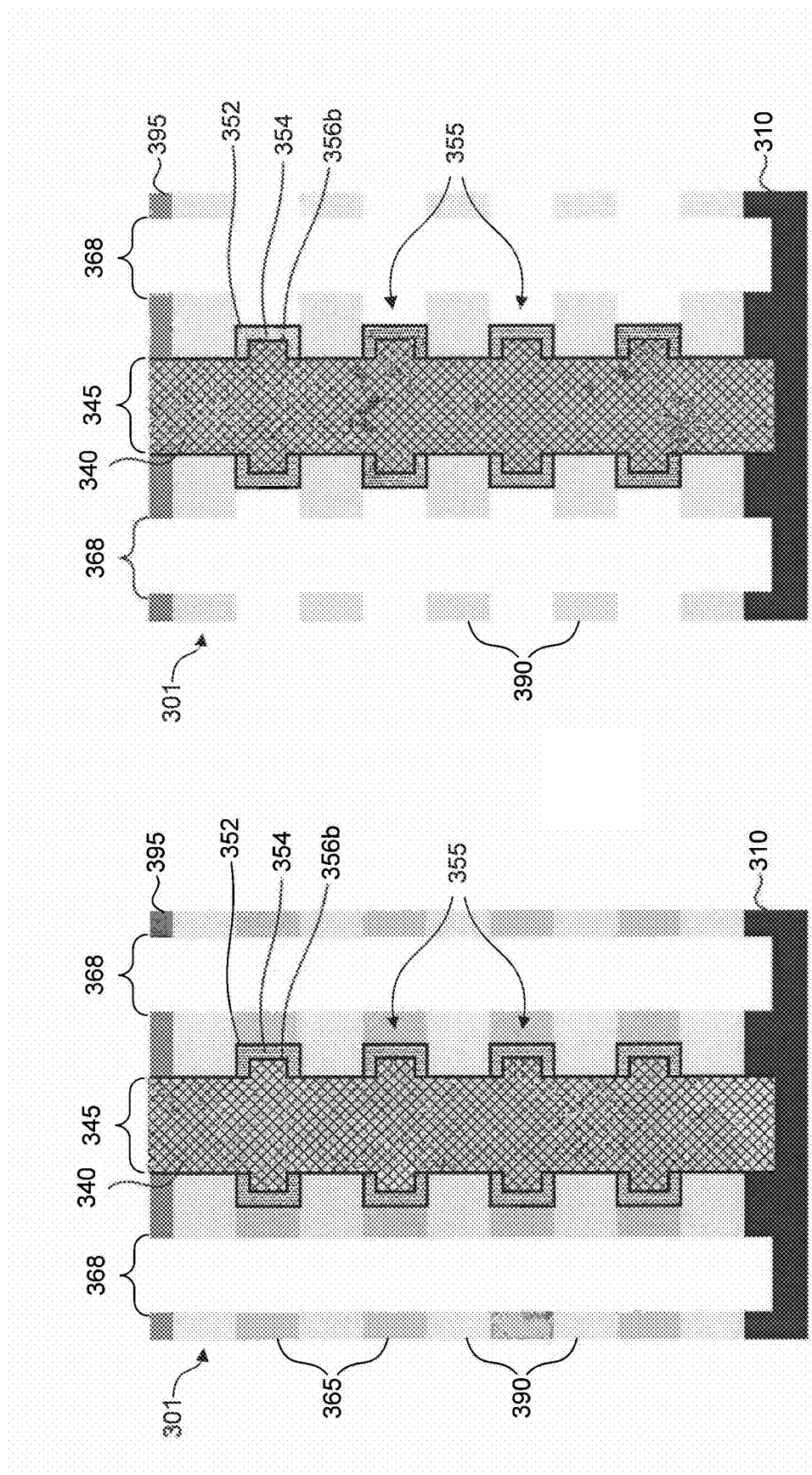

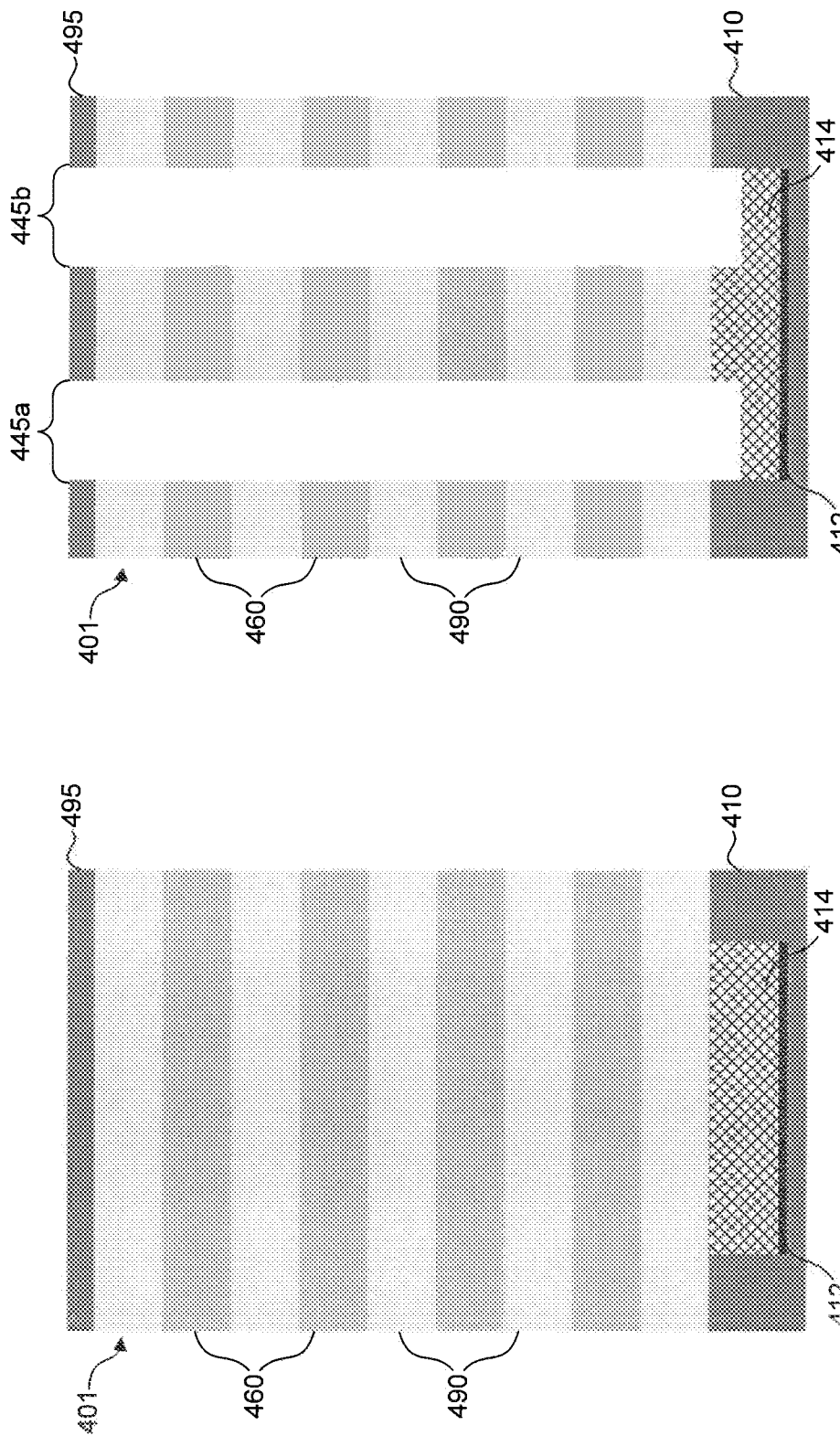

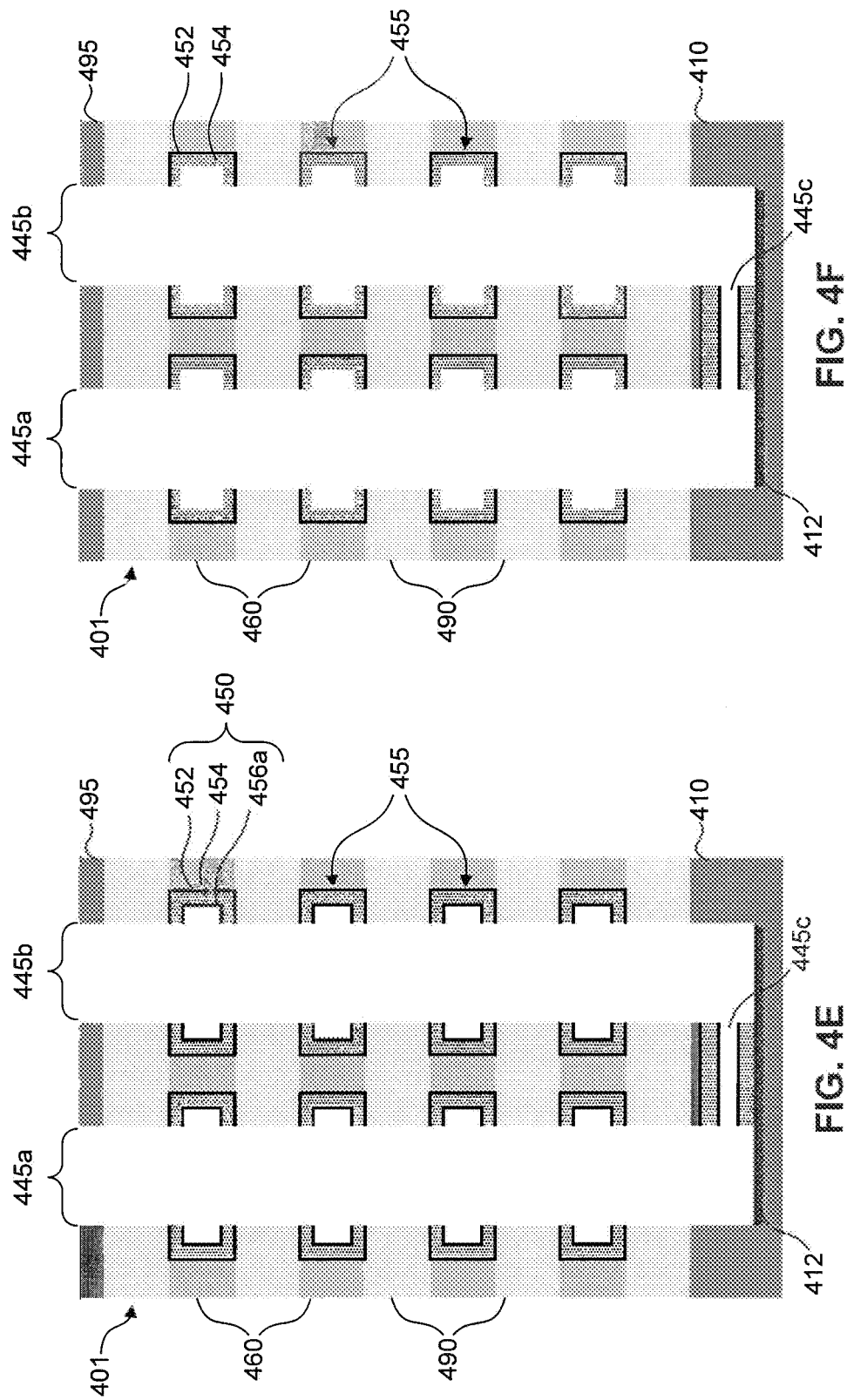

THREE-DIMENSIONAL CHARGE TRAPPING NAND CELL WITH DISCRETE CHARGE TRAPPING FILM

BACKGROUND

Technical Field

The disclosure generally relates to forming three-dimensional charge-trapping memory cells in a semiconductor device, and specifically to forming three-dimensional charge trapping memory cells with discrete charge trapping films.

Related Art

Charge trap semiconductors have become commercially viable for use in flash memory devices. In recent years, three-dimensional charge-trap semiconductor devices have been developed, which allow for memory cells to be constructed in both a horizontal and vertical matrix, thereby increasing memory capacity.

FIG. 1 illustrates a conventional three-dimensional charge-trap semiconductor device 100. The semiconductor device 100 includes a plurality of channel devices 140 vertically supported by a substrate 110. A cross-sectioned channel device 140A is illustrated in the foreground of FIG. 1 for ease of understanding, and is representative of each of the other channel devices 140. As can be seen from the channel device 140A, the channel devices 140 each pass through a corresponding select gate 170 and a plurality of control gates 160. Shortly before reaching the control gates 160, the channel device 140A becomes surrounded by a charge trap layer 150A (e.g., an ONO layer). Similar charge trap layers 150 are disposed on the other channel devices 140 at or near the control gates 160.

A memory cell is represented by each overlapping combination of a control gate 160 with a channel device 140 and ONO layer 150. The channel devices 140 are connected between corresponding bit lines 120 and source lines 130 used for addressing the various memory cells.

BRIEF DESCRIPTION OF THE DRAWINGS/FIGURES

Embodiments are described herein with reference to the accompanying drawings. In the drawings, like reference numbers generally indicate identical or functionally similar elements. Additionally, generally, the left most digit(s) of a reference number identifies the drawing in which the reference number first appears.

FIGS. 3A-3L illustrate vertical cross-sectional views of an exemplary semiconductor device at select steps of its manufacture according to an embodiment;

FIGS. 4A-4H illustrate vertical cross-sectional views of an exemplary semiconductor device at select steps of its manufacture according to an embodiment;

DETAILED DESCRIPTION

Deficiencies of Conventional Devices

Figure 1:
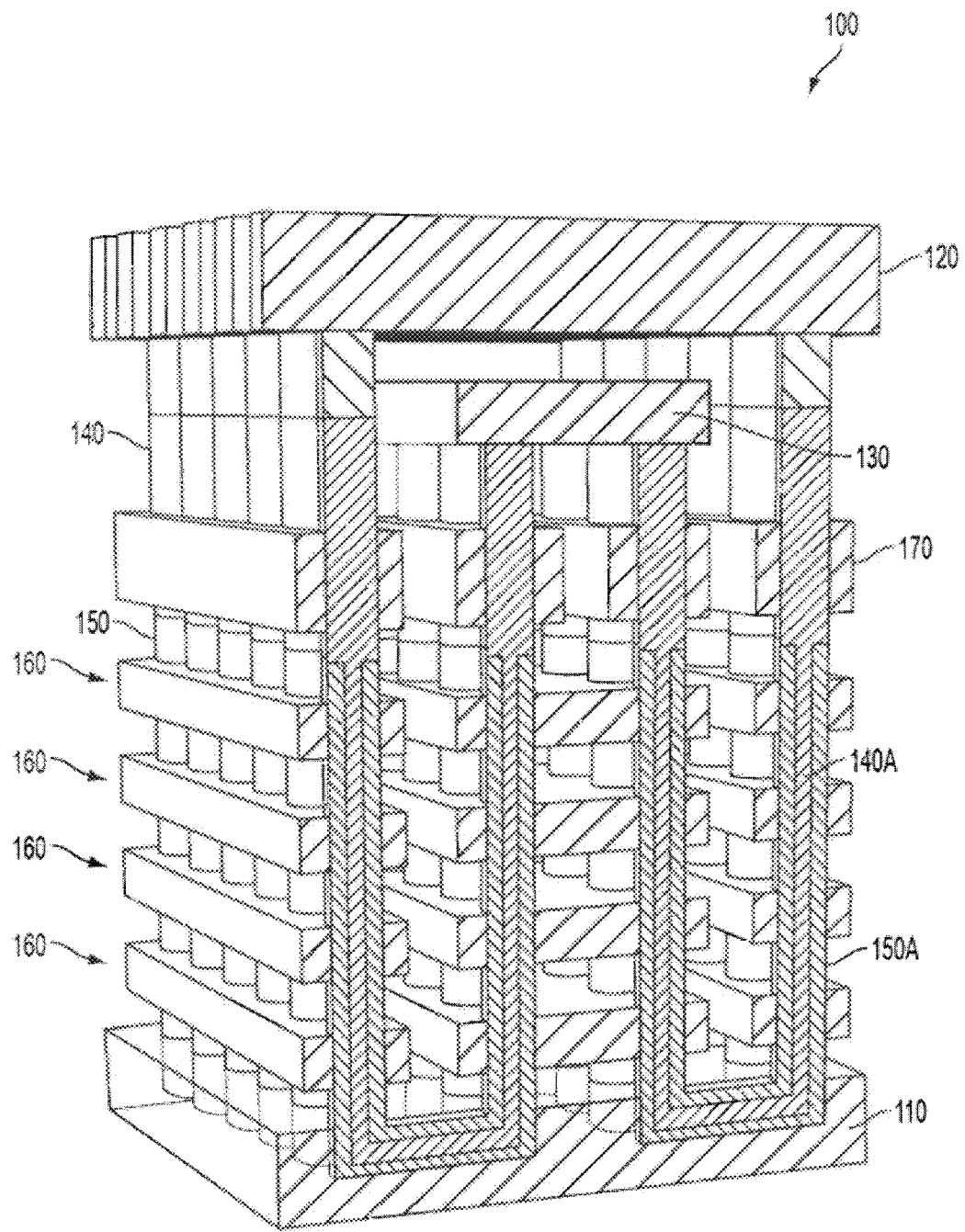
FIG. 1 illustrates a perspective view of a conventional three-dimensional semiconductor device.

As can be seen from the conventional three-dimensional charge-trapping semiconductor device 100, the charge trap layer 150 is made to be continuous between consecutive control gates 160. In other words, each charge trap layer 150 is used by multiple memory cells (combination of control gate 160 and corresponding channel device 140). This configuration can result in memory loss. Specifically, charge can migrate/move within the charge trap layer 150. Consequently, charge can accumulate between control gates 160, which can affect conductivity of the channel devices 140. This can cause bit errors, which can lead to memory loss.

Therefore, an improved three-dimensional semiconductor device is needed, which uses discrete charge trapping films for individual memory cells.

Exemplary Semiconductor Device

Figure 2:
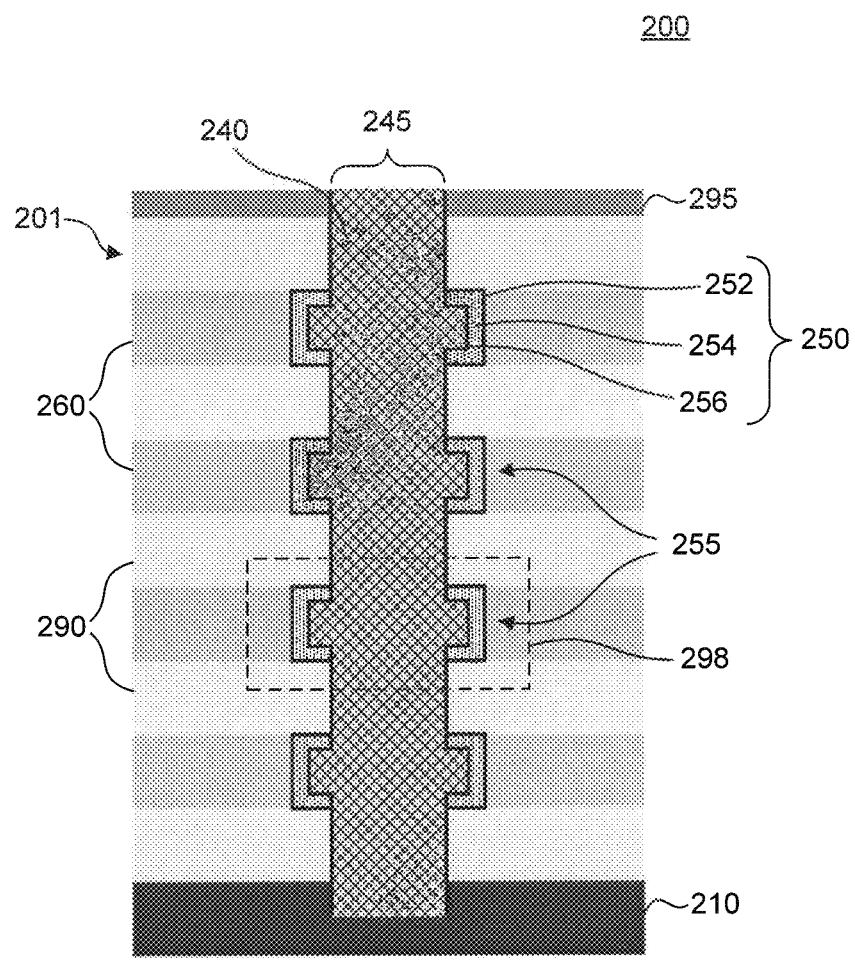
FIG. 2 illustrates a vertical cross-sectional view of an exemplary three-dimensional semiconductor device according to an embodiment.

FIG. 2 illustrates a vertical cross-sectional view of an exemplary three-dimensional semiconductor device 200 according to an embodiment. The semiconductor device 200 includes a layered stack 201 disposed over a substrate 210 that includes a plurality of control gates 260 alternating with a plurality of insulating layers 290. A mask 295 can be disposed over an upper surface of the stack 201.

A channel hole 245 is provided through the stack 201, which is filled with channel material to form a channel device 240. As shown in FIG. 2, each control gate 260 has its own charge trap layer section 255 that is separated from the charge trap layer sections 255 of the other control gates 260. These discrete charge trap layer sections 255 can be formed to be independent of each other through the use of a unique recessed control gate topography, in which the control gates 260 are recessed from the channel hole 245, as will be discussed in further detail below. The charge trap layer sections 255 each include a portion of a charge trap layer 250 that includes a silicon nitride layer 254 disposed between a first silicon dioxide layer 252 and a second silicon dioxide layer 256.

With this configuration, each memory cell 298 (which includes a combined control gate 260 and channel device 240) has its own distinct charge trap layer section 255. As a result, charge stored in the charge trap layer sections 255 is unable to migrate to nearby charge trap layers, or to charge trap material between control gates, as in the conventional devices. This greatly improves device performance, and significantly reduces bit error rates due to charge migration in the charge trap layers.

The semiconductor device 200 of FIG. 2 illustrates one non-limiting example of a three-dimensional semiconductor device according to the present disclosure. Multiple semiconductor configurations and their corresponding manufacturing processes will now be described in detail with respect to FIGS. 3-6.

Semiconductor Device with Separate Gate Elements

FIGS. 3A-3L illustrate vertical cross-sectional views of an exemplary semiconductor device 300 at select steps in its manufacture according to an embodiment.

Figure 3B:
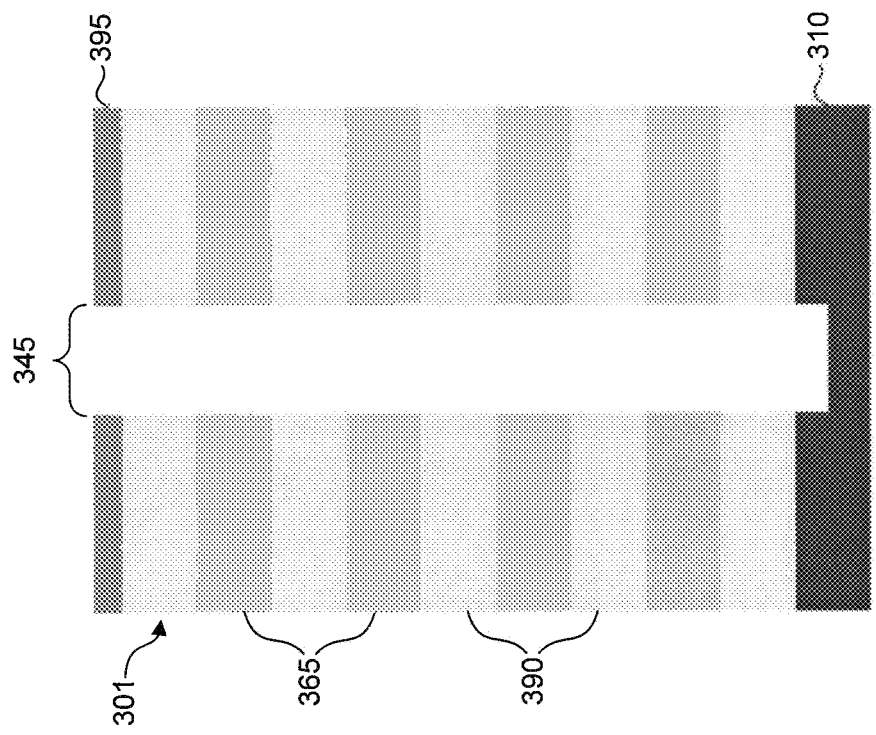
Figure 3A:
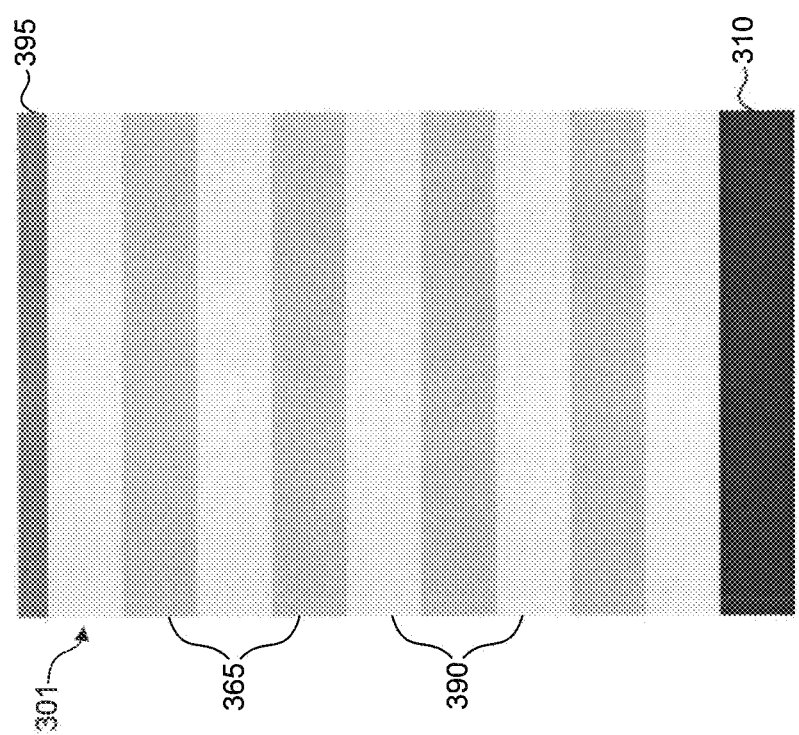

As illustrated in FIG. 3A, a plurality of insulating layers 390 and a plurality of gate layers 365 are initially disposed over a substrate 310 in an alternating manner to form a stack 301. The insulating layers 390 may include an oxide material, for example. The gate layers 365 may be formed of a nitride material, which acts as a placeholder for a future gate material, or may be formed of a polysilicon material, which can be used as the gate material directly. In an embodiment, an insulating layer 390 is a bottommost and uppermost layer of the stack 301. In an embodiment, a hardmask 395 is deposited over the uppermost layer of the stack 301. As shown in FIG. 3B, a channel hole 345 is then formed in the stack 301. The channel hole 345 can be formed, for example, using at least one of lithography and dry etching. The dry etching can be performed using any of a number of well-known dry etching chemicals, including $CF_4$, $CH_2F_2$, and $CHF_3$ to provide some examples.

Figure 3D:
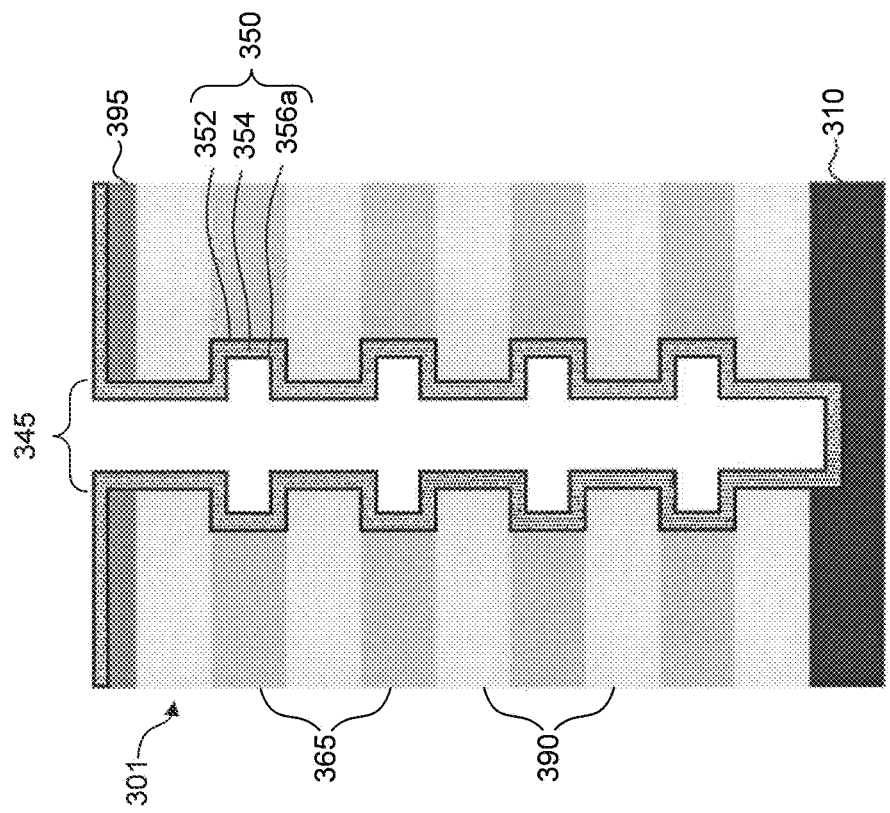
Figure 3C:
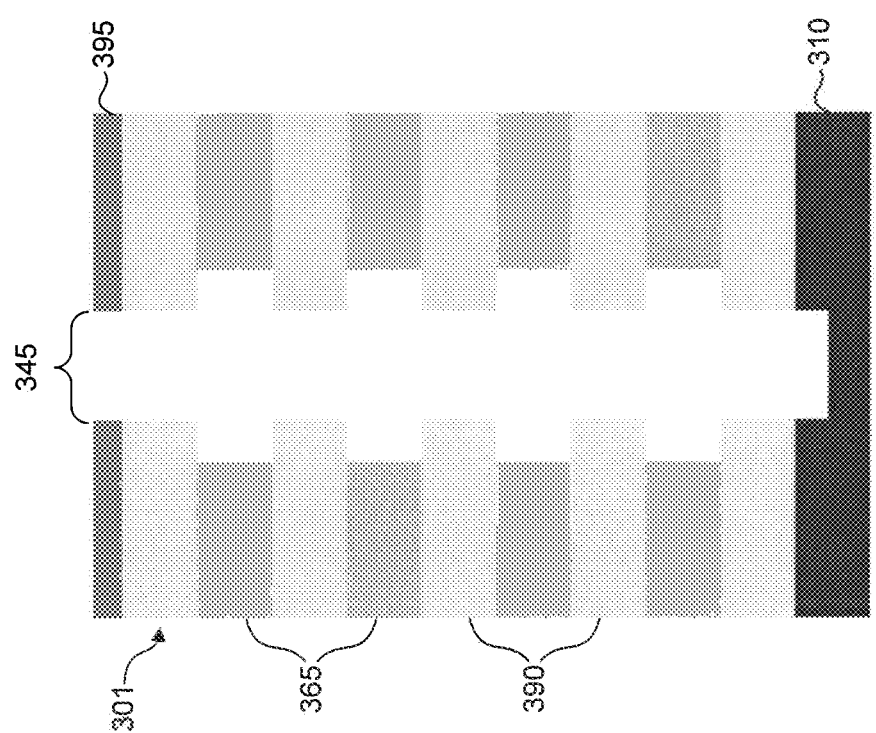

Once the channel hole 345 has been formed in the stack 301, the gate layers 365 are recessed from the channel hole 345, as shown in FIG. 3C. In other words, edges of the gate layers 365 that are adjacent the channel hole 345 are set back from the channel hole 345 as compared to the edges of the insulating layers 390. One option for recessing the gate layers 365 is by performing a wet etch. In an embodiment, the wet etch is highly selective to target the gate layers 365, and can employ any acceptable wet etching chemical known in the art, such as for example hot phosphoric acid for SiN wet etch.

After recessing the gate layers 365, a charge trap layer 350 can be deposited on the exposed surfaces of the stack 301, as shown in FIG. 3D. The charge trap layer 350 may represent an ONO layer, which includes, for example, a silicon nitride layer 354 disposed between a first silicon dioxide layer 352 and a second silicon dioxide layer 356a. In an embodiment, the silicon nitride layer 354 can be a silicon-rich nitride. The charge trap layer 350 can be deposited using any acceptable technique, including thermal growth, atomic layer deposition (ALD), or low-pressure chemical vapor deposition (LPCVD), and should be deposited one layer at a time.

After depositing the charge trap layer 350 on the exposed surfaces of the stack 301, a second etch is performed to remove portions of the charge trap layer 350 that are not contained within the recessed areas of the gate layers 365 of the stack 301. In an embodiment, this etch should be an anisotropic dry etch in order to remove only the portions of the charge trap layer 350 that are not recessed. As shown in FIG. 3E, the charge trap layer 350 is removed from the uppermost surface of the stack 301, as well as from the channel hole 345. Due to the unique recessed topography of the gate layers 365 of the stack 301 at this step, the etching of the exposed charge trap layer 350 results in individual charge trap layer sections 355 at corresponding gate layers 365, which will later become control gates 360.

In order to complete the charge trap layer sections 355, the charge trap layers 350 within those charge trap layer sections 355 should be repaired to replace the silicon dioxide layers removed by the dry etch. Therefore, as shown in FIG. 3F, the remaining silicon dioxide layer 356a is removed. This is done to prevent double-layering the inner silicon dioxide layer when the silicon dioxide is reformed. The removal of the remaining silicon dioxide layer 356a can be performed by an oxide wet strip, for example.

Figure 3H:
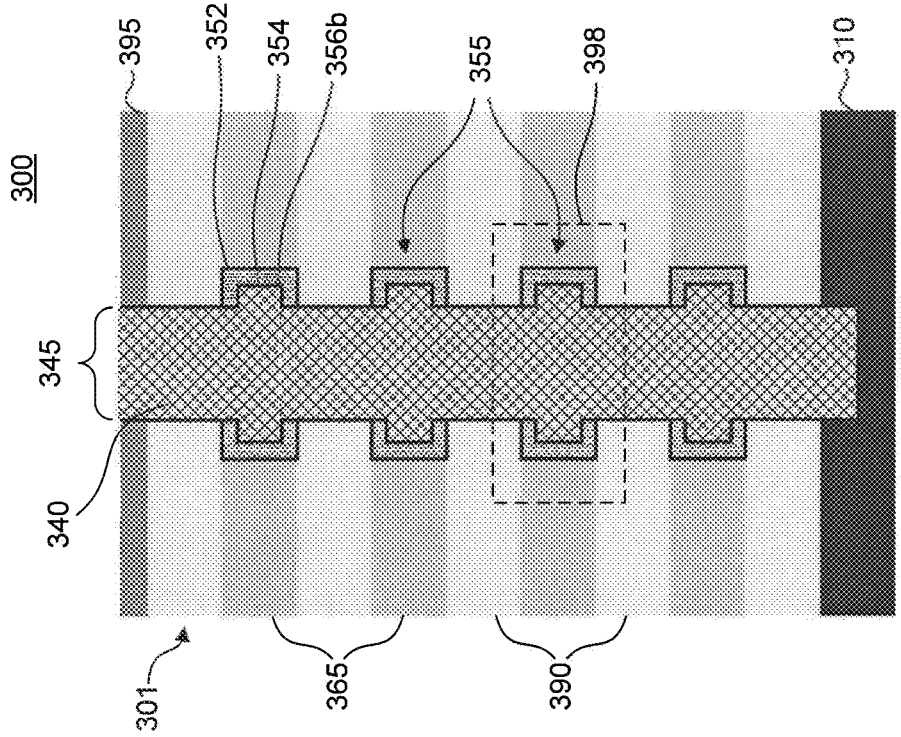
Figure 3G:
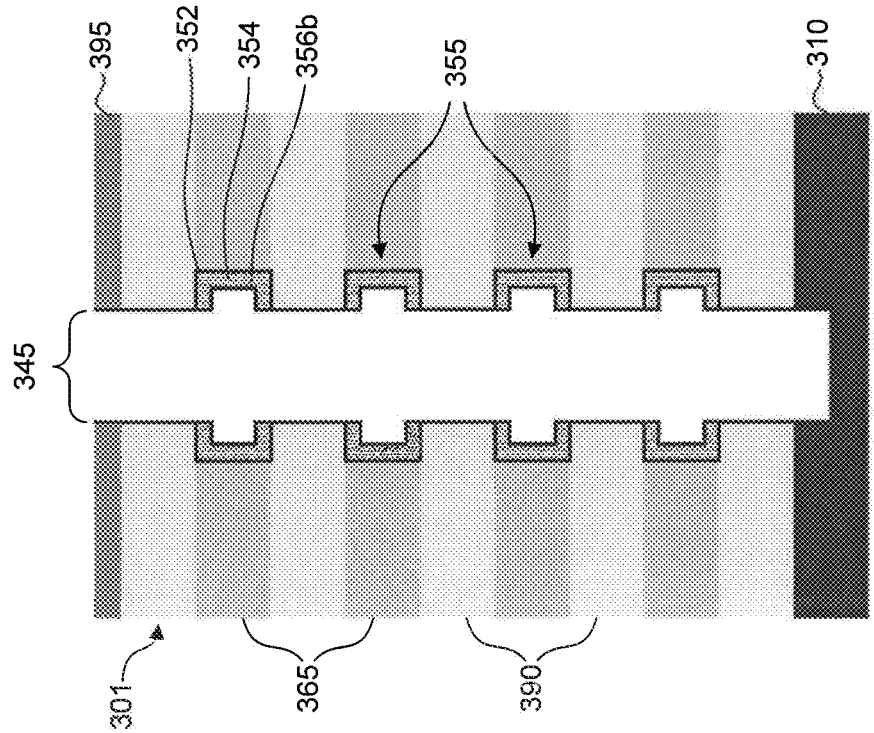

As shown in FIG. 3G, once the remaining silicon dioxide layer 356a is removed, a new silicon dioxide layer 356b can be deposited on the sidewall surfaces of the channel hole 345. As with the original deposition, the new silicon dioxide layer 356b can be deposited using any of thermal growth, ALD, or LPCVD. The deposition of the new silicon dioxide layer 356b effectively completes the charge layer sections 355, and can be continuous between adjacent charge trap layer sections 355. Therefore, the channel hole 345 can be filled with the channel material to form the channel device 340, as shown in FIG. 3H. In the completed semiconductor device 300 (as illustrated in FIG. 3H), separate memory cells 398 (comprising of overlapping gate layer 365, channel device 340, and charge trap layer section 355) include separate charge trap layers. The result is a vertical NAND string that contains the multiple memory devices 398.

As discussed above, the gate layers 365 can be originally formed of a polysilicon material or a nitride material. A benefit of forming the gate layers 365 of a polysilicon material is that the polysilicon material can be used directly as the final control gate elements. Therefore, once the channel device 340 is formed (see e.g., FIG. 3H), the semiconductor device 300 is complete, with the channel device 340 acting as a first functional element and the gate layers 365 acting as second functional layers of the semiconductor device. However, this approach restricts the control gate elements to the polysilicon material.

On the other hand, by forming the gate layers of the nitride material, the final control gate elements can be formed of any desired material. However, this approach requires additional steps, as will be discussed in detail below with respect to FIGS. 3I-3L.

As discussed above, FIGS. 3I-3L illustrate additional processing steps needed to complete the semiconductor device 300 when a nitride material is initially used for the gate layers 365. Specifically, because the nitride material acts only as a placeholder for gate material, and because the nitride material can not be used as a gate material itself, it is necessary to access and remove the nitride material from the stack 301, and to replace it with gate material.

In order to access the nitride material, a gate access trench 368 is formed in the stack 301 around the channel hole 345, as shown in FIG. 3I. The gate access trench 368 should be formed around the channel device 340, with a spacing between the gate access trench 368 and the charge trap layer sections 355 in order to provide an area for future gate material to be deposited. The gate access trench 368 can be formed by a dry etching process, such as described above for forming the channel hole 345.

Figure 3L:
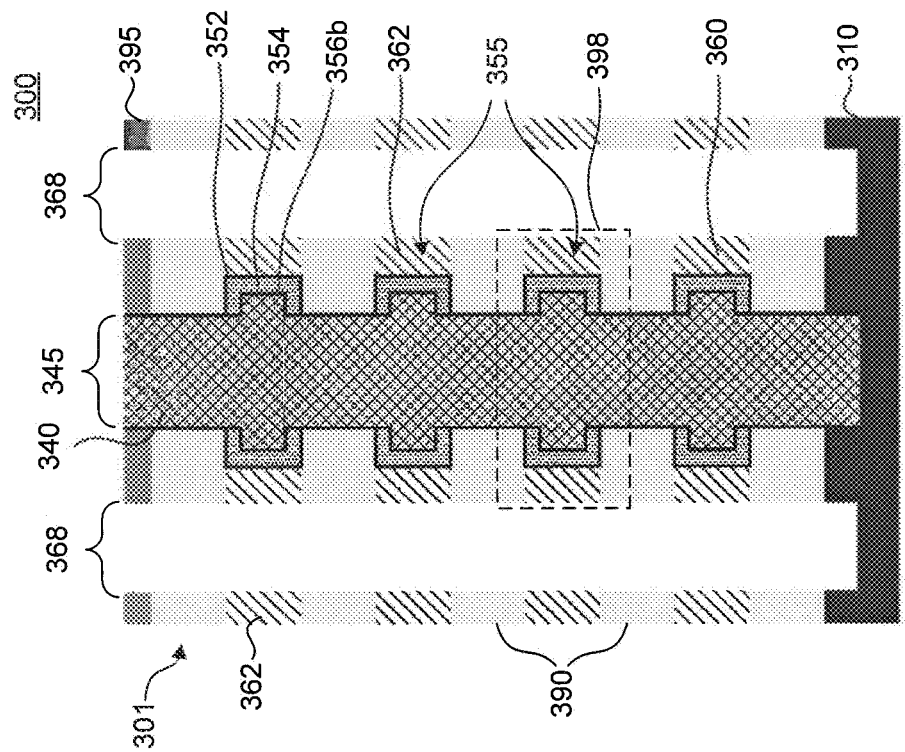
Figure 3K:
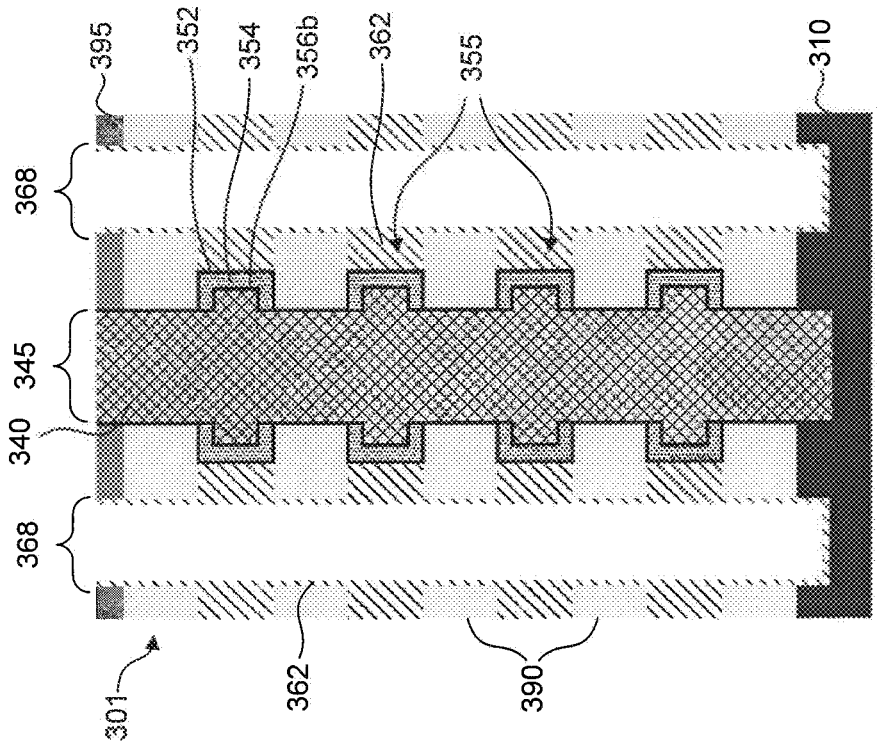

Once the gate access trench 368 has been formed, the nitride material of the gate layers 365 can be removed, as shown in FIG. 3J. This can be performed by a selective wet etching process. In an embodiment, the wet etching includes using a hot phosphoric acid to remove the nitride material. Once the nitride material has been removed, the spaces left behind by the removed nitride material can be filled with the gate material 362, as shown in FIG. 3K. The gate material 360 can be deposited using chemical vapor deposition, for example.

As a result of the gate material deposition, gate material 362 may be deposited on the sidewalls of the gate access trench 368. This is undesired, as it effectively shorts the different gates 360 to each other. Therefore, a subsequent dry etch can be performed to remove the gate material 362 from the sidewalls of the gate access trench 368, as shown in FIG. 3L. The remaining gate material 362 disposed adjacent the charge trap layer sections 355 each results in a control gate 360 for controlling one or more memory cells 398. This effectively completes the semiconductor device 300, with the channel device 340 acting as a first functional element and the control gates 360 acting as second functional elements. The result is a vertical NAND string that contains the multiple memory devices 398.

As shown in each of the semiconductor devices 300 illustrated in FIGS. 3H and 3L, by forming the semiconductor device 300 with the recessed gate layer topography, separate and distinct charge trap layer sections 355 can be formed for each memory cell 398. This configuration reduces charge migration within the charge trap layer to other memory cells and/or areas between memory cells, thereby reducing potential bit errors and/or other memory failures.

It should be noted that, although the above description and related figures describe constructing a single column of memory cells in a semiconductor device, the above steps can be repeated for any number of columns of memory cells.

Semiconductor Device with U-Shaped Channel Device

FIGS. 4A-4G illustrate vertical cross-sectional views of an exemplary semiconductor device 400 at select steps in its manufacture according to an embodiment.

In some circumstances, it may be preferred to manufacture the semiconductor device with a U-shaped channel device. For example, the U-shaped channel device may provide for an increased number of memory cells in a given area, and may reduce manufacturing steps. As with the above examples, by using a unique gate layer topography, a semiconductor device with a U-shaped channel device can be manufactured to have discrete charge trap layer sections, as shown in detail below with respect to FIGS. 4A-4G.

As shown in FIG. 4A, a substrate 410 has embedded therein a sacrificial (SAC) layer 414 disposed on an etch-stop layer 412. A plurality of insulating layers 490 and gate layers 460 are disposed in an alternating manner over the substrate 410 to form a stack 401. In an embodiment, an insulating layer 490 disposed as a bottommost layer and an uppermost layer of the stack 401. In an embodiment, a hard-mask layer 495 is disposed over the uppermost surface of the stack 401.

Channel holes are 445a and 445b are formed in the stack 401, as shown in FIG. 4B. The channel holes 445a and 445b are preferably spaced apart from one another and extend partially into the SAC layer 414. The channel holes 445 can be formed using at least one of lithography and dry etching, as discussed above with respect to the channel hole 345.

Figure 4D:
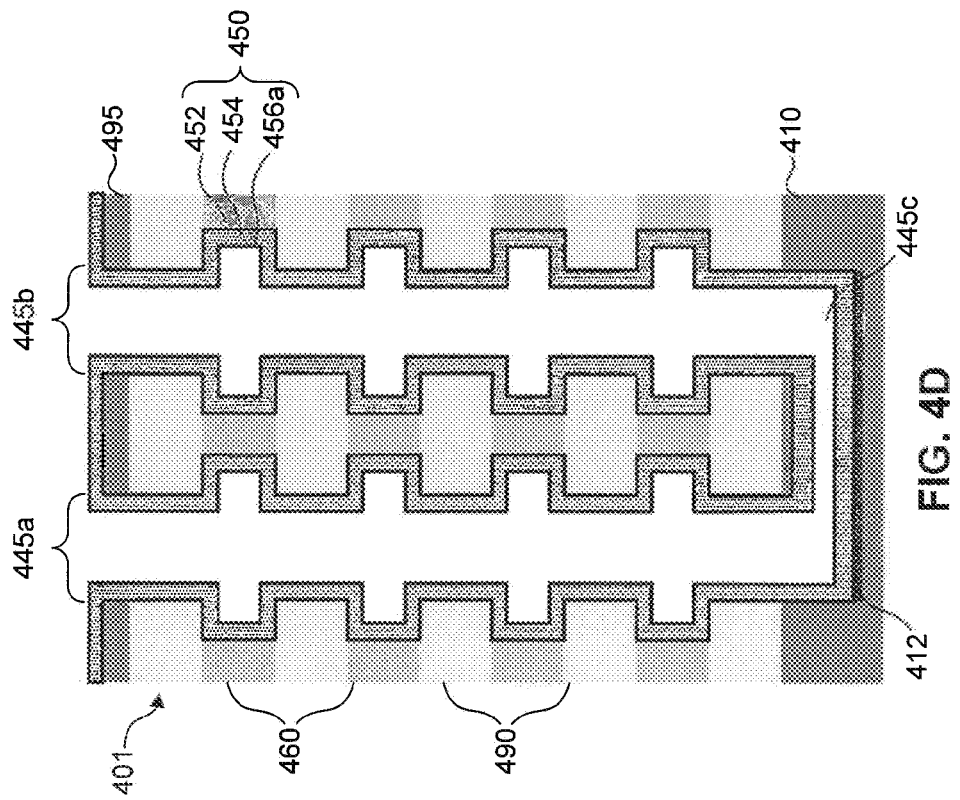
Figure 4C:
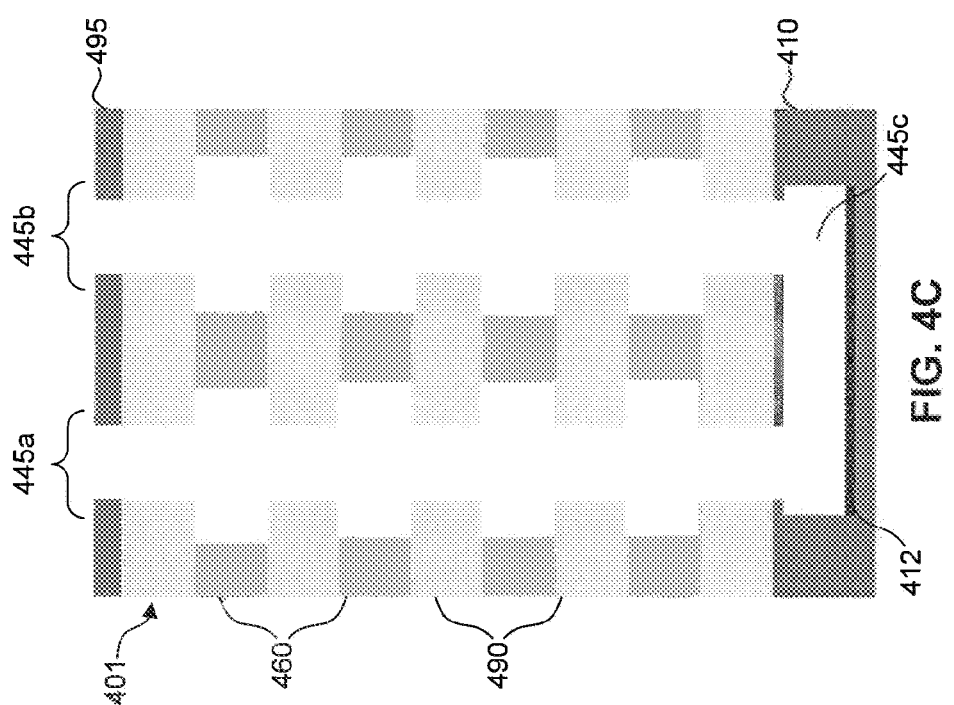

Once the channel holes 445 have been formed in the stack 401, the gate layers 460 are recessed from the channel holes 445, as shown in FIG. 4C. In other words, edges of the gate layers 460 that are adjacent the channel holes 445 are set back from the channel holes 445 as compared to the edges of the insulating layers 490. At this time, the SAC layer 414 can also be removed. The recessing of the gate layers 460 and the removal of the SAC layer 414 can be performed in subsequent wet etches, or by a single wet etch, depending on a material of the SAC layer 414. The wet etch can employ, for example, TetraMethylAmmonium Hydroxide (TMAH). The removal of the SAC layer 414 connects the channel holes 445a and 445b by a channel hole bridge 445c.

Once the gate layers 460 have been recessed and the SAC layer 414 has been removed, the charge trap layer 450 can be deposited, as shown in FIG. 4D. The charge trap layer 450 may represent an ONO layer having the configuration described above, with a silicon nitride layer 454 disposed between a first silicon dioxide layer 452 and a second silicon dioxide layer 456a. In an embodiment, the silicon nitride layer 454 is a silicon-rich nitride. The charge trap layer 450 can be deposited using any acceptable technique, including thermal growth, atomic layer deposition (ALD), or low-pressure chemical vapor deposition (LPCVD), and should be deposited one layer at a time. As shown in FIG. 4D, the deposition of the charge trap layer 450 will result in the charge trap layer 450 coating all exposed surfaces of the semiconductor device, including an uppermost surface, inner and outer sidewalls of the channel holes 445a and 445b, and top and bottom surfaces of the channel hole bridge 445c.

After depositing the charge trap layer 450 on the exposed surfaces of the stack 401, a second etch is performed to the charge trap layer 450 at the channel holes 445a and 445b. This etch should be an anisotropic dry etch in order to remove only the portions of the charge trap layer 450 that are not recessed. As shown in FIG. 4E, the charge trap layer 450 is removed from the uppermost surface of the stack 401, as well as from the channel holes 445a and 445b. Due to the unique recessed topography of the gate layers 460 of the stack 401 at this step, the etching of the exposed charge trap layer 450 results in individual charge trap layer sections 455 at corresponding gate layers 460. In an embodiment, the etching of exposed charge trapping layers 450 involves only layers 456a and 454.

Because the charge trap layer 450 is also effectively "recessed" within the channel hole bridge 445c (underneath the stacked layers), a portion of the charge trap layer 450 also remains within the channel hole bridge 445c. However, as this portion is separated from the other charge trap layer sections 455, it will not have any negative performance effects.

In order to complete the charge trap layer sections 455, the charge trap layer 450 should be repaired to replace the silicon dioxide layers removed by the dry etch. Therefore, as shown in FIG. 4F, remaining silicon dioxide layer 456a is removed. This is to prevent double-layering the inner silicon dioxide layer when the silicon dioxide is reformed. The removal of the remaining silicon dioxide layer 456a can be performed by an oxide wet strip, for example.

Figure 4H:
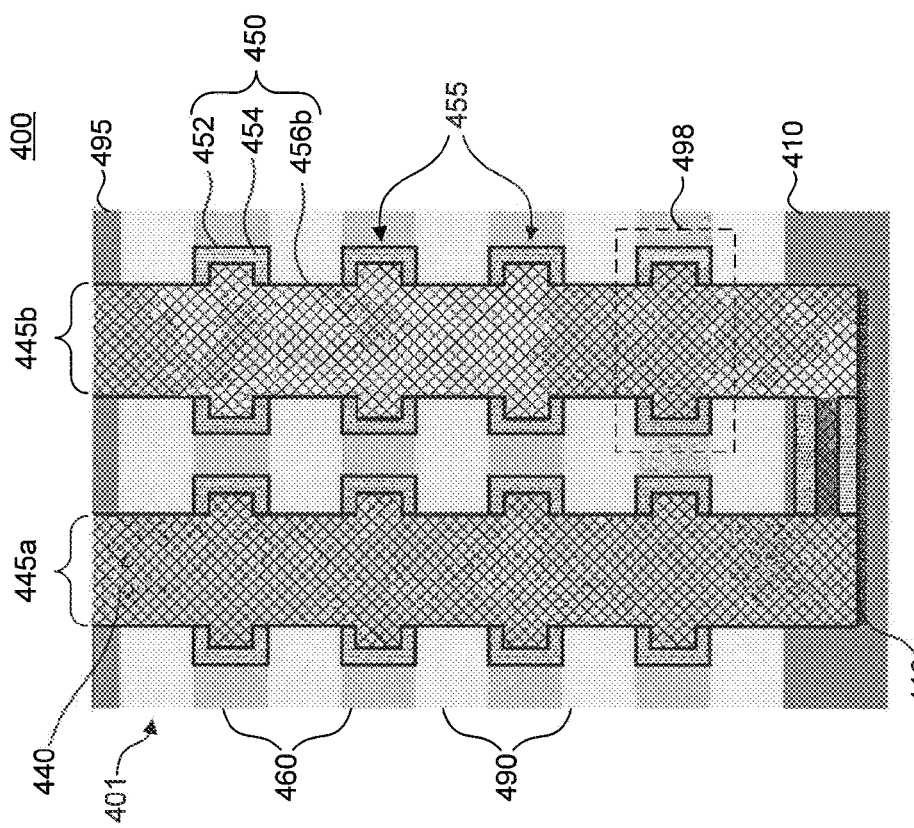
Figure 4G:
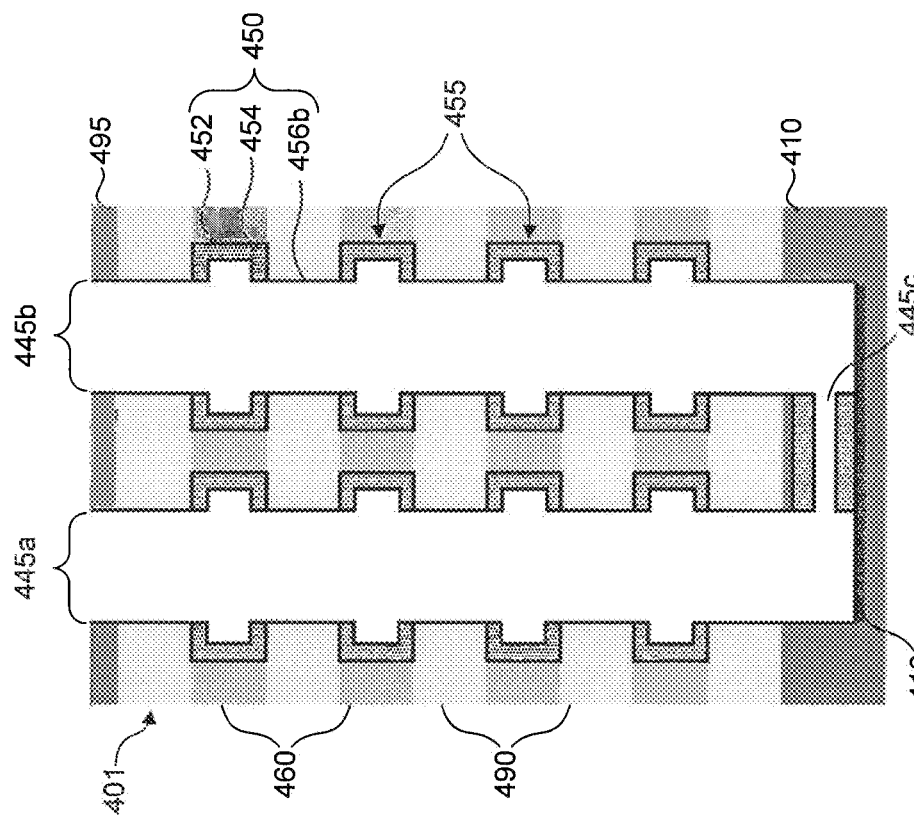

As shown in FIG. 4G, once the remaining silicon dioxide layer 456a is removed, a new silicon dioxide layer 456b can be deposited on the sidewall surfaces of the channel holes 445a and 445b, as well as the channel hole bridge 445c. As with the original deposition, the new silicon dioxide layer 456b can be deposited using any of thermal growth, ALD, or LPCVD. The deposition of the new silicon dioxide layer 456b effectively completes the charge trap layer sections 455, and may be continuous between adjacent charge trap layer sections 455. Therefore, the channel hole 445 can be filled with the channel material to form the channel device 440, as shown in FIG. 4H. Once the channel device 440 is formed, the semiconductor device 400 is complete, with the channel device 440 acting as a first functional element and the gate layers 460 acting as second functional elements.

With this configuration, it is preferable to use a polysilicon material for the gate layers 460, so that the original layered polysilicon material of the stack 401 can be used as the final control gates. Once again, the resulting semiconductor device 400 includes memory cells 498 (corresponding to overlapping gate layers 460, channel device 440, and charge trap layer sections 455) with distinct charge trap layer sections 455.

It should be noted that although the above description and related figures describes a U-shaped channel, the steps described can similarly be applied to generate similar configurations in which any number of channel columns stem from one or more channel bridges.

Semiconductor Device with Channel Elements

FIGS. 5A-5H illustrate vertical cross-sectional views of an exemplary semiconductor device 500 at select steps in its manufacture according to an embodiment.

In previous embodiments, gate layers were initially deposited in the stack so as to create independent gate elements for the final semiconductor devices. However, in some circumstances, it may be preferred to instead deposit channel layers in the stack so as to form independent channel elements in the final semiconductor device. One reason for this configuration may be to have a common gate element among several memory cells and to allow the gate material for that gate element to be selected as any desired material. The ability to choose a gate material can be useful in many circumstances. Similarly to previous embodiments, a unique layer topography (this time in the channel layers) can be employed to create discrete charge trap layer sections for each memory cell, while achieving the desired results.

Figure 5B:
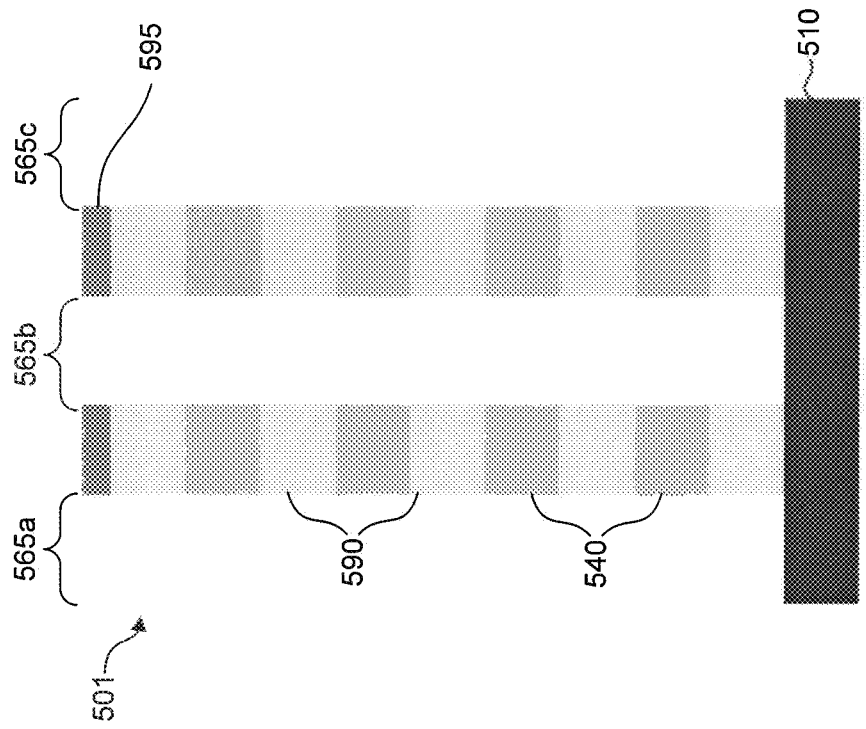
FIGS. 5A-5H illustrate vertical cross-sectional views of an exemplary semiconductor device at select steps of its manufacture according to an embodiment.
Figure 5A:
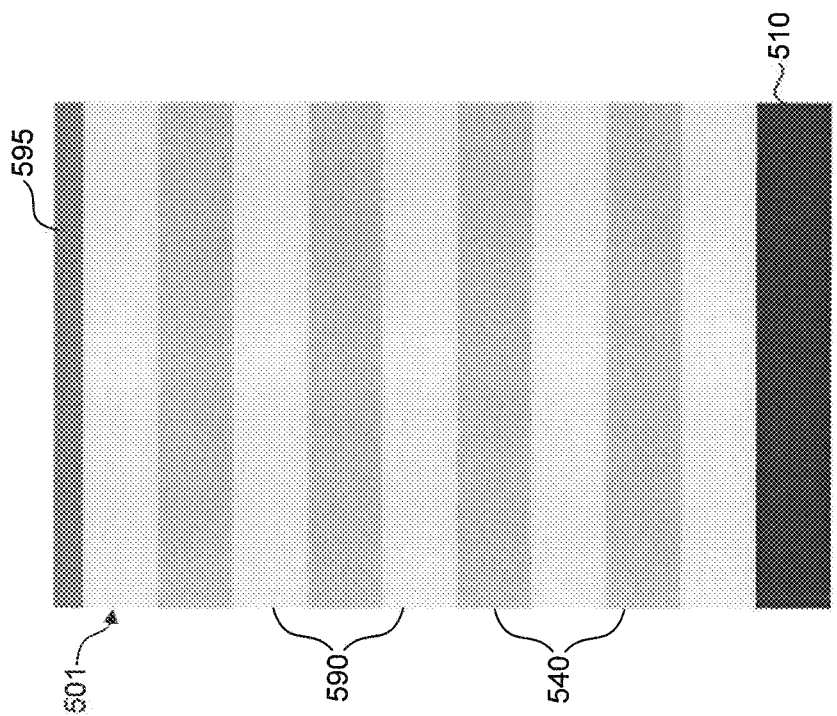

As shown in FIG. 5A, a plurality of insulating layers 590 and channel layers 540 are disposed in an alternating manner over the substrate 510 to form a stack 501. In an embodiment, an insulating layer 590 disposed as a bottommost layer and an uppermost layer of the stack 501. In an embodiment, the insulating layers 590 may be oxide materials, whereas the channel layers may be a polysilicon material. The polysilicon material may be different from, or the same as the polysilicon material described above for use as the gate layers 365. However, even when the polysilicon material is the same as that of the gate layers 365, it nonetheless preferably includes a different doping concentration and/or dopant. A mask 595 is disposed over the uppermost surface of the stack 501.

Stack trench 565*a*, 565*b*, and 565*c* are formed in the stack 501, as shown in FIG. 5B. Although this example illustrates three stack trenches 565 in order to create two separate substacks, any number of stack trenches 565 can be created in order to form one or more substacks. The stack trenches 565 preferably extend to the substrate 510. The stack trenches 565 can be formed using at least one of lithography and dry etching, as discussed above with respect to the channel hole 345. In an embodiment, a trench may have a continuous slot or line shape in the stack when viewed from above, whereas a hole may have a circular or ovular shape.

Figure 5D:
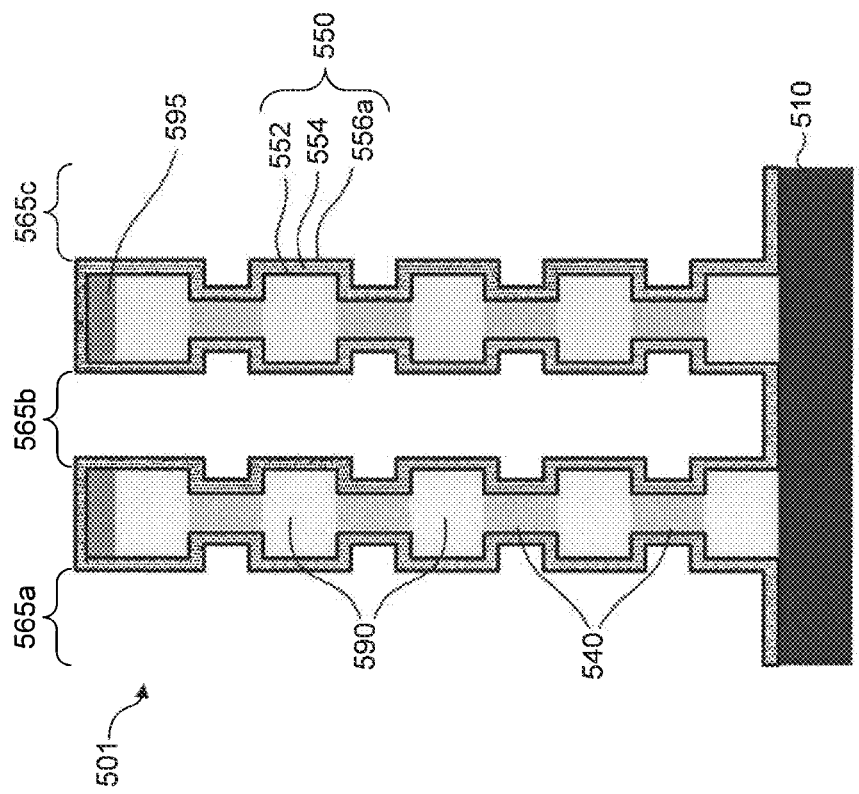
Figure 5C:
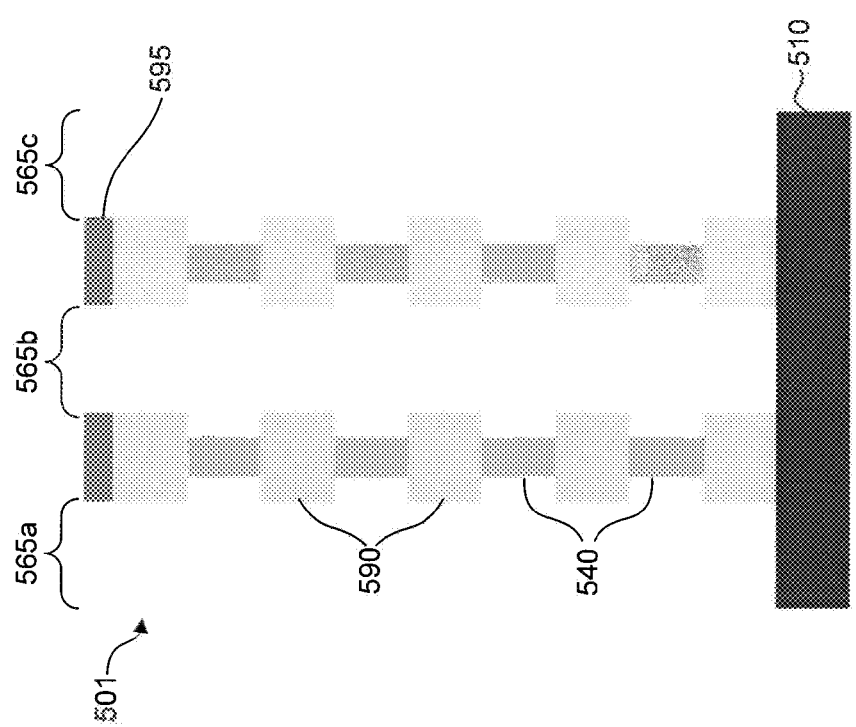

Once the stack trenches 565 have been formed in the stack 501, the channel layers 540 are recessed from the stack trenches 565, as shown in FIG. 5C. In other words, edges of the channel layers 540 that are adjacent the stack trenches 565 are set back from the stack trenches 565 as compared to the edges of the insulating layers 590. The recessing of the channel layers 540 can be performed by a wet etch. The wet etch can employ, for example, TMAH.

Once the channel layers 540 have been recessed, the charge trap layer 550 can be deposited, as shown in FIG. 5D. The charge trap layer 550 may represent an ONO layer having the configuration previously described, with a silicon nitride layer 554 disposed between a first silicon dioxide layer 552 and a second silicon dioxide layer 556*a*. In an embodiment, the silicon nitride layer 554 is a silicon-rich nitride. The charge trap layer 550 can be deposited using any acceptable technique, including thermal growth, ALD, or LPCVD, and should be deposited one layer at a time. As shown in FIG. 5D, the deposition of the charge trap layer 550 will result in the charge trap layer 550 coating all exposed surfaces of the semiconductor device, including an uppermost surface, sidewalls of the stack trenches 565, and exposed surfaces of the substrate 510.

Figure 5F:
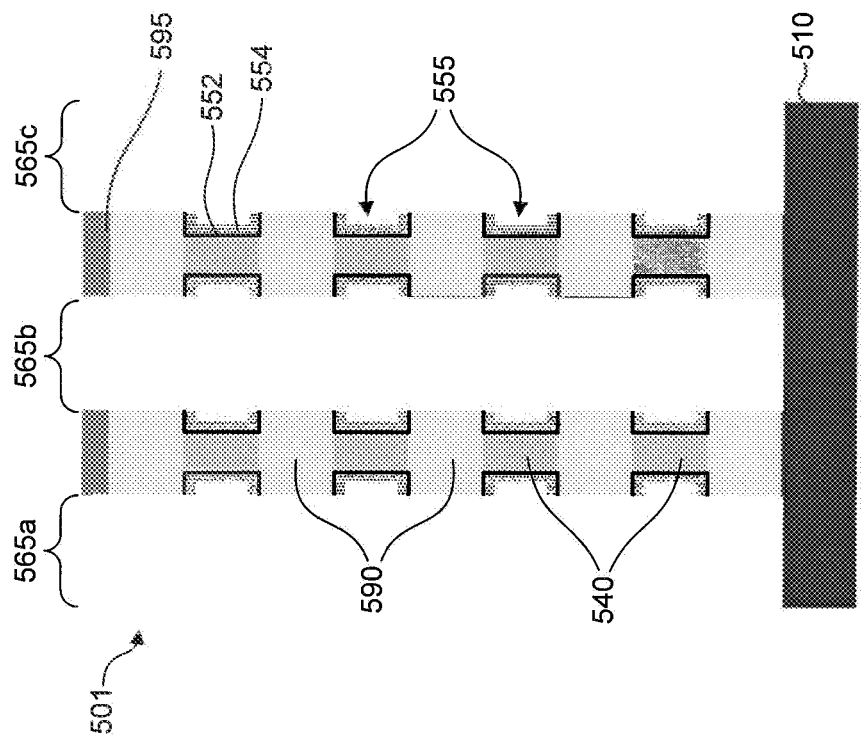
Figure 5E:
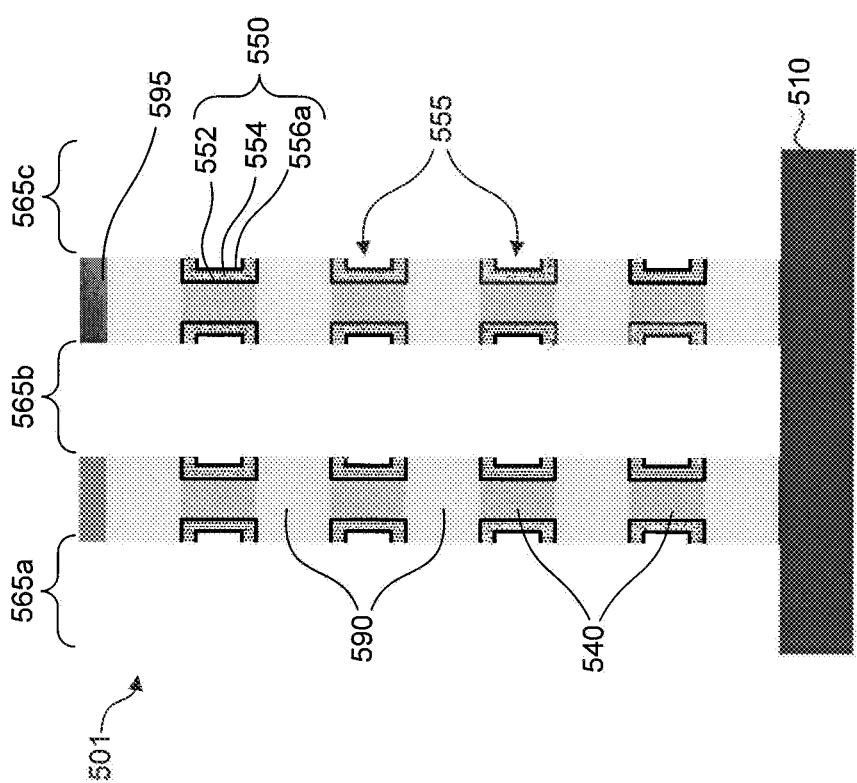

After depositing the charge trap layer 550 on the exposed surfaces of the stack 501, a second etch is performed to the charge trap layer 550 at the stack trenches 565. This etch should be a selective anisotropic dry etch in order to remove only the portions of the charge trap layer 550 that are not recessed. As shown in FIG. 5E, the charge trap layer 550 is removed from the uppermost surface of the stack 501, from exposed sidewalls of the stack trenches 565, and from exposed surfaces of the substrate 510. Due to the unique recessed topography of the channel layers 540 of the stack 501 at this step, the etching of the exposed charge trap layer 550 results in individual charge trap layer sections 555 at corresponding channel layers 540.

In order to complete the charge trap layer sections 555, the charge trap layer 550 should be repaired to replace the silicon dioxide layers removed by the dry etch. Therefore, as shown in FIG. 5F, remaining silicon dioxide layer 556*a* is removed. This is to prevent double-layering the inner silicon dioxide layer when the silicon dioxide is reformed. The removal of the remaining silicon dioxide layer 556*a* can be performed by an oxide wet strip, for example.

Figure 5H:
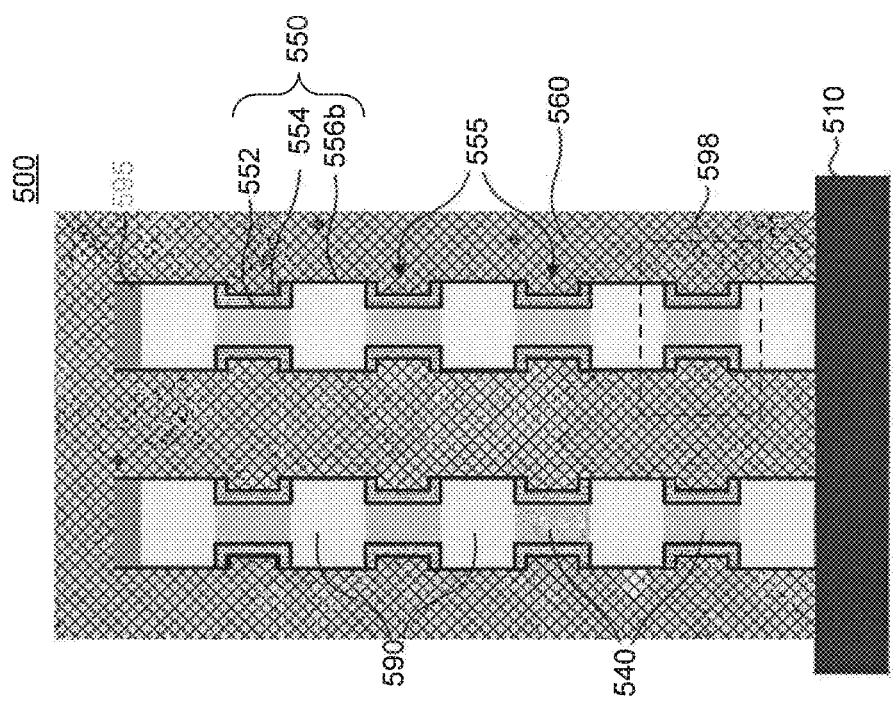
Figure 5G:
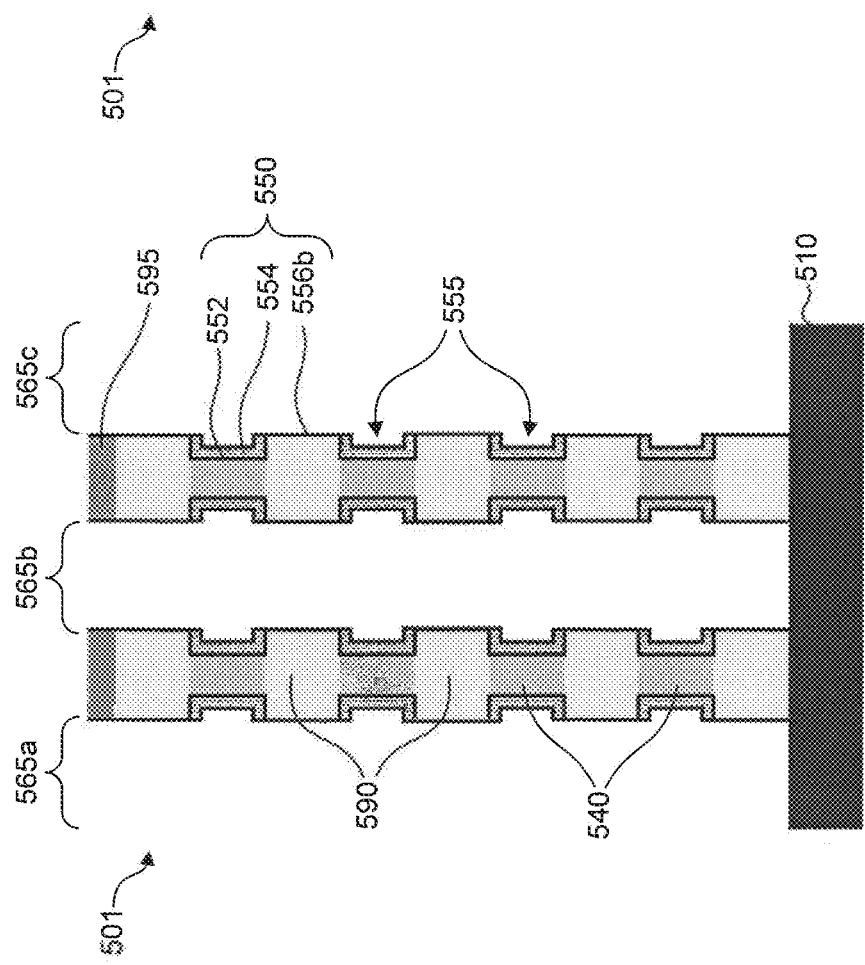

As shown in FIG. 5G, once the remaining silicon dioxide layer 556*a* is removed, a new silicon dioxide layer 556*b* can be deposited on the sidewall surfaces of the gate holes 565. As with the original deposition, the new silicon dioxide layer 556*b* can be deposited using any of thermal growth, ALD, or LPCVD. The deposition of the new silicon dioxide layer 556*b* effectively completes the charge trap layer sections 555. Therefore, the stack trenches 565 can be filled with the desired gate material to form the gate element 560, as shown in FIG. 5H. Once the gate element 560 is formed, the semiconductor device 500 is complete, with the gate element 560 acting as a first functional element and the channel layer 540 acting as second functional elements of the semiconductor device 500. This process again results in memory cells 598 (overlapping gate 560, channel layers 540, and charge trap layer sections 555) with distinct charge trap layer sections 555. In this device, a NAND device channel 540 is formed along the silicon string, and the NAND gate can be formed by separating gate element 560 into slices in a direction perpendicular to the NAND string.

Each of the above-described embodiments illustrates different process steps to achieve different results. However, these differences are not mutually exclusive, but rather can be selectively employed among any of the described embodiments. For example, channel layers can be formed in the U-shaped embodiment to form separate channel elements, etc.

Figure 6:
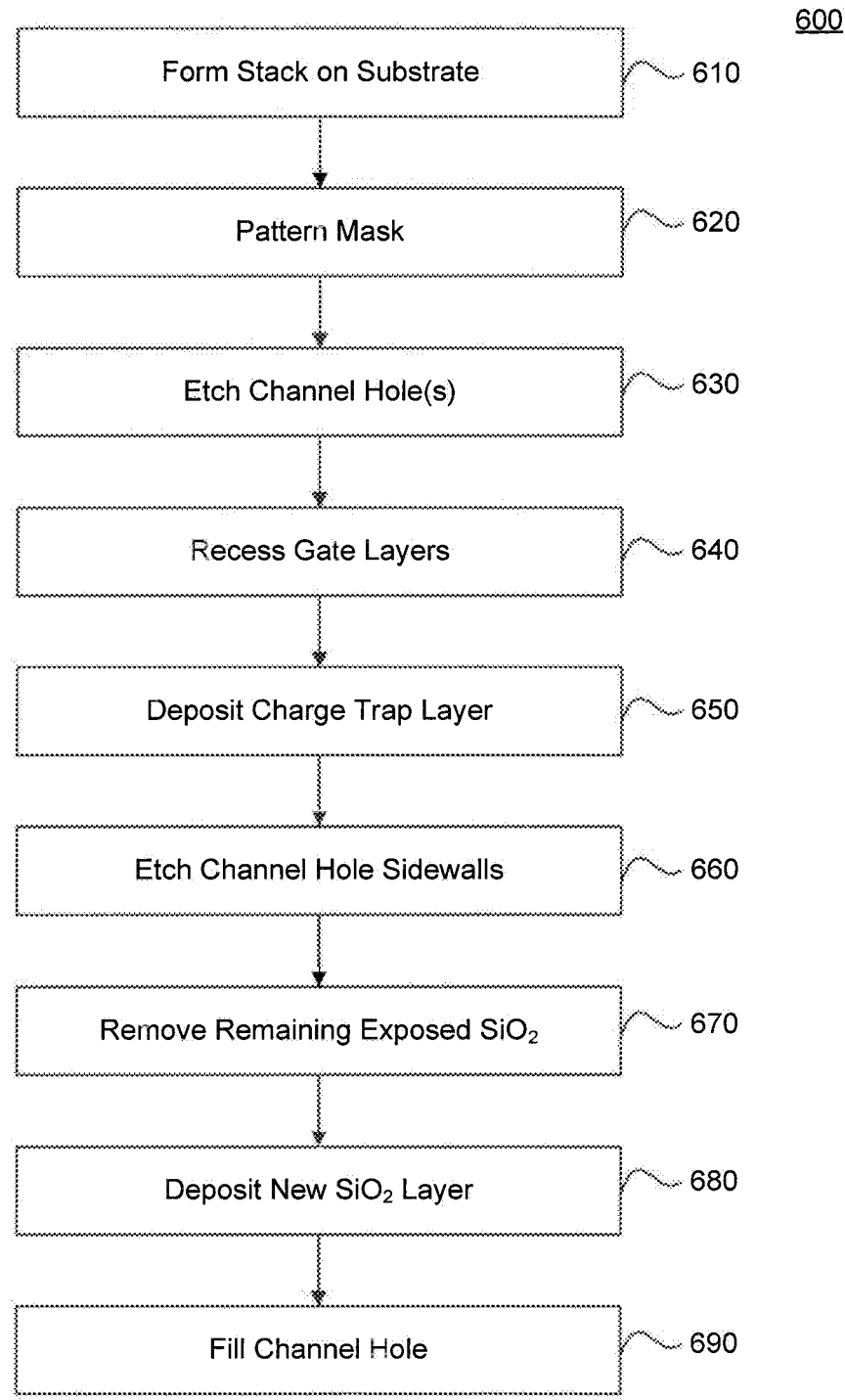
FIG. 6 illustrates a flowchart diagram of an exemplary method for making a three-dimensional semiconductor device according to an embodiment.

Exemplary Method of Forming a Semiconductor Device with Discrete Charge Trap Layers FIG. 6 illustrates a flowchart diagram of an exemplary method for making a three-dimensional semiconductor device according to an embodiment. Solely for illustrative purposes, the steps illustrated in FIG. 6 will be described with reference to semiconductor steps illustrated in FIGS. 3A-3H.

In step 610, a plurality of insulating layers 390 and a plurality of gate layers 365 are initially disposed over a substrate 310 in an alternating manner to form a stack 301 (FIG. 3A). The insulating layers 390 may have an oxide material, for example. The gate layers 365 may be formed of a nitride material, which acts as a placeholder for a future gate material, or may be formed of a polysilicon material, which can be used as the gate material directly. In an embodiment, an insulating layer 390 is a bottommost and uppermost layer of the stack 301.

In step 620, a photo resist layer 395 is patterned over the uppermost layer of the stack 301. In step 630, and as shown in FIG. 3B, a channel hole 345 is then formed in the stack 301. The channel hole 345 can be formed using at least one of lithography and dry etching. The dry etching can be performed using any of a number of well-known dry etching chemicals, including $CF_4$, $CH_2F_2$, and $CHF_3$ to provide some examples.

Although the example of FIG. 3 uses gate layers 365 and a channel hole 345 for later forming a channel 340, it will be understood that, in an embodiment, the stack can instead include channel layers (e.g., 540 in FIG. 5A) and a stack trench (e.g., 565 in FIG. 5B) to later become a gate element (e.g., 560 in FIG. 5H). In such a configuration, the following method steps applied to the gate layers 365, channel hole 345, and channel device 340 would similarly be applied to the channel layers 540, stack trench 565, and gate element 560, respectively.

Continuing with the method, in step 640, once the channel hole 345 has been formed in the stack 301, the gate layers 365 are recessed from the channel hole 345, as shown in FIG. 3C. In other words, edges of the gate layers 365 that are adjacent the channel hole 345 are set back from the channel hole 345 as compared to the edges of the insulating layers 390. One option for recessing the gate layers 365 is by performing a wet etch. The wet etch should be highly selective to target the gate layers 365, and can employ any acceptable wet etching chemical known in the art, such as for example hot phosphoric acid to etch SiN, or TMAH to etch silicon.

In step 650, after recessing the gate layers 365, a charge trap layer 350 can be deposited on the exposed surfaces of the stack 301, as shown in FIG. 3D. The charge trap layer 350 may represent an ONO layer, which includes, for example, a silicon nitride layer 354 disposed between a first silicon dioxide layer 352 and a second silicon dioxide layer 356a. In an embodiment, the silicon nitride layer 354 can be a silicon-rich nitride. The charge trap layer 350 can be deposited using any acceptable technique, including thermal growth, atomic layer deposition (ALD), or low-pressure chemical vapor deposition (LPCVD), and should be deposited one layer at a time.

In step 660, after depositing the charge trap layer 350 on the exposed surfaces of the stack 301, a second etch is performed to remove portions of the charge trap layer 350 that are not contained within the recessed areas of the gate layers 365 of the stack 301. This etch should be an anisotropic dry etch in order to remove only the portions of the charge trap layer 350 that are not recessed. As shown in FIG. 3E, the charge trap layer 350 is removed from the uppermost surface of the stack 301, as well as from the channel hole 345. Due to the unique recessed topography of the gate layers 365 of the stack 301 at this step, the etching of the exposed charge trap layer 350 results in individual charge trap layer sections 355 at corresponding gate layers 365, which will later become control gates 360.

In order to complete the charge trap layer sections 355, the charge trap layer 350 should be repaired to replace the silicon dioxide layers removed by the dry etch. Therefore, in step 670, and as shown in FIG. 3F, remaining silicon dioxide layer 356a is removed. This is to prevent double-layering the inner silicon dioxide layer when the silicon dioxide is reformed. The removal of the remaining silicon dioxide layer 356a can be performed by an oxide wet strip, for example.

In step 680, and as shown in FIG. 3G, once the remaining silicon dioxide layer 356a is removed, a new silicon dioxide layer 356b can be deposited on the sidewall surfaces of the channel hole 345. As with the original deposition, the new silicon dioxide layer 356b can be deposited using any of thermal growth, ALD, or LPCVD. The deposition of the new silicon dioxide layer 356b effectively completes the charge layer sections 355. Therefore, the channel hole 345 can be filled with the channel material to form the channel device 340 (690), as shown in FIG. 3H.

As discussed above, the gate layers 365 can be originally formed of a polysilicon material or a nitride material. A benefit of forming the gate layers 365 of a polysilicon material is that the polysilicon material can be used directly as the final control gate elements. Therefore, in step 690, once the channel device 340 is formed, the semiconductor device 300 is complete.

With this method 600, separate and distinct charge trap layer sections can be formed for each memory cell using the recessed gate layer topography. This configuration reduces charge migration within the charge trap layer to other memory cells and/or areas between memory cells, thereby reducing potential bit errors and/or other memory failures.

It should be noted that, although the above method description and related figures describe constructing a single column of memory cells in a semiconductor device, the above steps can be repeated for any number of columns of memory cells.

Those skilled in the relevant art(s) will recognize that the above method 600 can additionally or alternatively include any of the steps or substeps described above with respect to FIGS. 3A-3H, as well as any of their modifications. Further, the above description of the exemplary method 600 should not be construed to limit the description of the apparatus 300 described above.

Exemplary Expanded Method for Forming a Three-Dimensional Semiconductor Device with Discrete Charge Trap Layers The method 600 described above provides one example for manufacturing a three-dimensional semiconductor device with discrete charge-trap layers. However, the method 600 of FIG. 6 uses a polysilicon material to form control gates. When another material is desired as the material of the control gates, additional steps should be taken to replace the original gate layer material with a preferred gate material. In this embodiment, the original gate layer material can be either a polysilicon material or a silicon nitride material.

Figure 7:
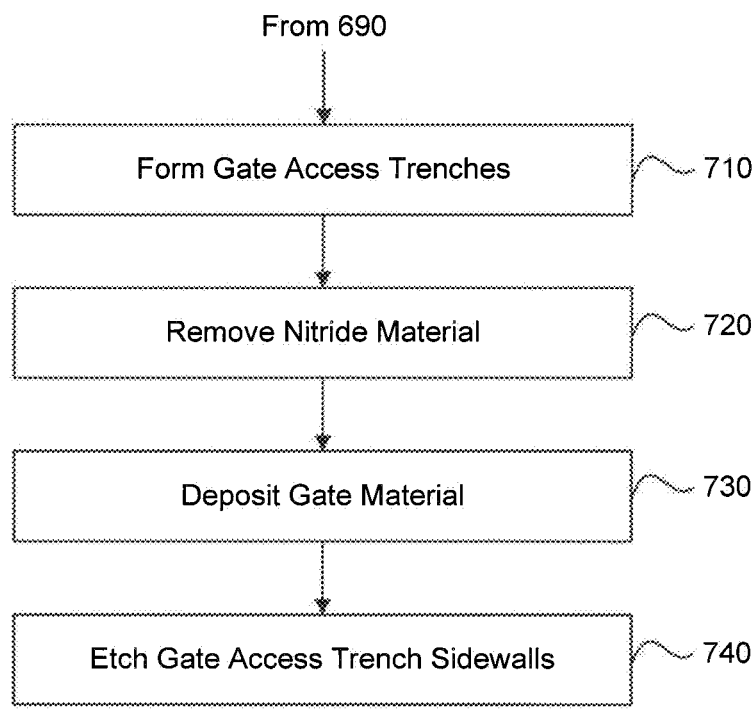
FIG. 7 illustrates a flowchart diagram of an exemplary expanded method for making a three-dimensional semiconductor device according to an embodiment.

FIG. 7 illustrates a flowchart diagram 700 of an exemplary expanded method 700 of manufacturing a three-dimensional semiconductor device according to an embodiment. Solely, for illustrative purposes, the following method steps will be described with reference to FIGS. 3I-3L. These method steps of flowchart 700 follow after performance of steps 610-690, illustrated in FIG. 6 and described above.

In step 710, in order to access the nitride material, a gate access trench 368 is formed in the stack 301, as shown in FIG. 3I. The gate access trench 368 should be formed around the channel device 340, with a spacing between the gate access trench 368 and the charge trap layer sections in order to provide an area for future gate material to be deposited. The gate access trench 368 can be formed by a dry etching process, such as described above for forming the channel hole 345.

In step 720, once the gate access trench 368 has been formed, the nitride material can be removed, as shown in FIG. 3J. This can be performed by a selective wet etching process. In an embodiment, the wet etching includes using a hot phosphoric acid to remove the nitride material. In step 730, once the nitride material has been removed, the spaces left behind by the removed nitride material can be filled with the gate material 362, as shown in FIG. 3K. The gate material 362 can be deposited using chemical vapor deposition, for example.

As a result of the gate material deposition, gate material 362 may be deposited on the sidewalls of the gate access trench 368. This is undesired, as it effectively shorts the different gates 360 to each other. Therefore, in step 740, a subsequent dry etch can be performed to remove the gate material 362 from the sidewalls of the gate access trench 368, as shown in FIG. 3L. The remaining gate material 362 disposed adjacent the charge trap layer sections each results in a control gate 360 for controlling one or more memory cells. This effectively completes the semiconductor device 300.

As noted above, this method 700 allows for separate and distinct charge trap layer sections to be formed for each memory cell using the recessed gate layer topography. This configuration reduces charge migration within the charge trap layer to other memory cells and/or areas between memory cells, thereby reducing potential bit errors and/or other memory failures.

It should be noted that, although the above method description and related figures describe constructing a single column of memory cells in a semiconductor device, the above steps in flowchart 700 can be repeated for any number of columns of memory cells.

Those skilled in the relevant art(s) will recognize that the above method 700 can additionally or alternatively include any of the steps or substeps described above with respect to FIGS. 3A-3H, as well as any of their modifications. Further, the above description of the exemplary method 700 should not be construed to limit the description of the apparatus 300 described above.

CONCLUSION

It is to be appreciated that the Detailed Description section, and not the Summary and Abstract sections (if any), is intended to be used to interpret the claims. The Summary and Abstract sections (if any) may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the invention should not be limited by any of the above-described exemplary embodiments, but should be defined only in accordance with the following claims and their equivalents.

What is claimed is:

1. A three-dimensional semiconductor device, comprising:
    a substrate;
    a plurality of insulating layers;
    a plurality of second functional elements interleaved with the plurality of insulating layers, inner walls of the plurality of insulating layers and the plurality of second functional elements defining a channel hole, and each second functional element and adjacent insulating layers defining a recess;
    a first functional element disposed in the channel hole and extending vertically from the substrate; and
    a plurality of charge trap structures, each disposed between the first functional element and a corresponding second functional element,
        wherein the charge trap layers each comprises at least three sub-layers, wherein the at least three sub-layers comprise a first oxide layer and a second oxide layer;
        wherein each of the charge trap layers is separate and discrete from the other charge trap layers; and
        wherein the charge trap layers share the first oxide layer, and wherein the first oxide layer is in physical contact with the first functional element and extends into the recesses.

2. The three-dimensional semiconductor device of claim 1, wherein a corresponding one of the plurality of insulating layers is disposed between each of the second functional elements.

3. The three-dimensional semiconductor device of claim 2, wherein the second functional elements are recessed from the first functional element relative to inner edges of the plurality of insulating layers to create the corresponding recesses.

4. The three-dimensional semiconductor device of claim 3, wherein the charge trap layers are disposed in the corresponding recesses.

5. The three-dimensional semiconductor device of claim 1, wherein the first functional element is a channel device, and
    wherein the second functional elements are control gates.

6. A three-dimensional semiconductor device, comprising:
    a substrate;
    a plurality of insulating layers;
    a plurality of a second functional elements interleaved with the plurality of insulating layers, inner walls of the plurality of insulating layers and the plurality of second functional elements defining a trench, and each second functional element and adjacent insulating layers defining a recess;
    a first functional element disposed in the trench and extending vertically from the substrate; and
    a plurality of charge trap layers, each disposed between the first functional element and a corresponding second functional element,
        wherein each of the charge trap layers is separate and discrete from the other charge trap layers;

wherein the charge trap layers each comprise a plurality of sub-layers; and wherein the charge trap layers each share at least one, but fewer than all, of the plurality of sub-layers, the at least one shared charge trap layer extending into the recesses; and wherein the first functional element is a control gate and the second functional elements are channel devices.

7. The three-dimensional semiconductor device of claim 6, wherein a corresponding one of the plurality of insulating layers is disposed between each of the second functional elements.

8. The three-dimensional semiconductor device of claim 7, wherein the second functional elements are recessed from the first functional element relative to inner edges of the plurality of insulating layers to create the corresponding recesses.

9. The three-dimensional semiconductor device of claim 8, wherein the charge trap layers are disposed in the corresponding recesses.

* * * * *